United States Patent [19]

Takano et al.

[11] Patent Number: 4,839,583

[45] Date of Patent: Jun. 13, 1989

[54] SIGNAL ANALYZER APPARATUS WITH ANALOG PARTIAL SWEEP FUNCTION

[75] Inventors: Mitsuyoshi Takano, Tokyo; Seiryo Fukaya, Ebina, both of Japan

[73] Assignee: Anritsu Corporation, Tokyo, Japan

[21] Appl. No.: 211,964

[22] Filed: Jun. 27, 1988

[30] Foreign Application Priority Data

Jul. 1, 1987 [JP] Japan ................................. 62-165039

[51] Int. Cl.⁴ .......................................... G01R 23/16
[52] U.S. Cl. .................................. 324/77 B; 364/485
[58] Field of Search ........... 364/485; 324/77 R, 77 A, 324/77 B, 77 C, 77 CS, 78 E, 312, 121 R; 358/95; 356/152

[56] References Cited

U.S. PATENT DOCUMENTS

| | | | |
|---|---|---|---|
| 3,899,250 | 8/1975 | Bamberg et al. | 358/95 |
| 3,947,119 | 3/1976 | Bamberg et al. | 358/95 |
| 3,975,675 | 8/1976 | Dunand | 324/312 |
| 4,015,087 | 3/1977 | Stewart | 324/77 B |
| 4,154,531 | 5/1979 | Roberts | 356/152 |
| 4,244,024 | 1/1981 | Marzalek et al. | 364/485 |
| 4,253,152 | 2/1981 | Holdaway | 364/485 |
| 4,257,104 | 3/1981 | Martin et al. | 364/485 |
| 4,264,958 | 4/1981 | Rowell | 324/77 B |
| 4,611,164 | 9/1986 | Mitsuyoshi | 324/77 B |
| 4,652,816 | 3/1987 | Crookshanks | 324/77 B |

Primary Examiner—Michael J. Tokar

Attorney, Agent, or Firm—Frishauf, Holtz, Goodman & Woodward

[57] ABSTRACT

A frequency converter converts an input signal into an intermediate frequency signal corresponding to a local oscillation signal to be analog-swept from a local oscillator. An A/D converter converts the intermediate frequency signal into the corresponding digital signal. A memory stores the digital signal in accordance with its a frequency. A display displays the digital signal stored in the memory along a frequency axis. A sweep signal generator receives first or second sweep measurement frequency range setting data from a sweep range setting unit and supplies the data to the local oscillator as the analog sweep signal for an entire or partial sweep operation. Upon reception of the first sweep measurement frequency range setting data, a display controller causes the display to display the digital signal stored in the memory in correspondence with the analog sweep signal for the entire sweep operation. Upon reception of the second sweep measurement frequency range setting data present in the first range from the sweep range setting unit, the display controller causes the display to update and display the digital signal of a portion corresponding to the second sweep measurement frequency range which is updated in the memory in correspondence with the analog sweep signal for the partial sweep operation.

7 Claims, 9 Drawing Sheets

FIG. 3-iii

SIGNAL ANALYZER APPARATUS WITH ANALOG PARTIAL SWEEP FUNCTION

BACKGROUND OF THE INVENTION

1. Field of the Invention

This invention relates to a signal analyzer apparatus with an analog partial sweep function and, more particularly, to a spectrum analyzer which, when a stable signal such as a carrier wave signal and a variation signal such as noise or side-band wave adjacent to the stable signal are monitored, allows an easy monitoring of a variation signal while monitoring the relationship with the stable signal, in an apparatus used for spectrum analysis of a signal.

Also the invention relates to the following spectrum analyzer. In a spectrum analyzer for displaying a frequency along the abscissa and an analyzed signal level along the ordinate on a display screen, when a given frequency range (fi to fh) is set and carrier wave fc and side-band wave fd within the frequency range are monitored, an operator often wants to store the value of carrier wave fc and to monitor a variation in side-band wave fd. In this case, the spectrum analyzer of this invention can designate and sweep-measure only a frequency range (fm to fn, where fi<fm, fn<fh) around the side-band wave, and can store and display a spectrum in frequency ranges (fi to fm) and (fn to fh) excluding the range (fm to fn) (this function will be referred to as a partial sweep function hereinafter).

2. Description of the Related Art

Figure 5A:
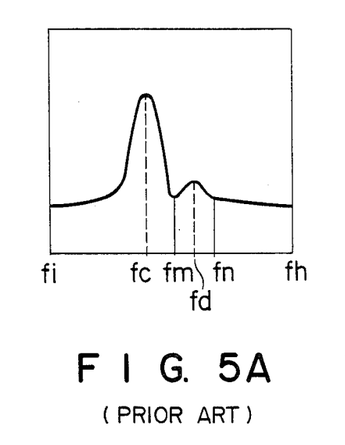
FIGS. 5A and 5B are views showing conventional display states.
Figure 5B:
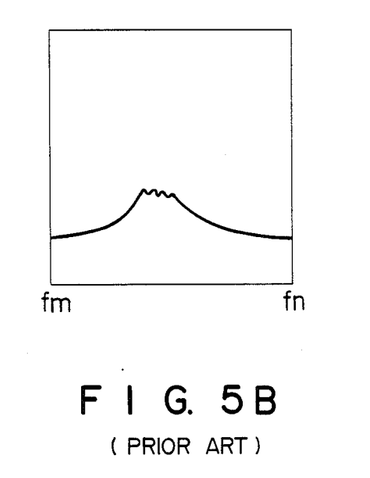

The partial sweep function cannot be performed by a conventional spectrum analyzer. In the conventional spectrum analyzer, carrier wave fc as shown in FIG. 5A is monitored. At this time, if side-band wave fd is present and a variation in wave fd is to be monitored, a frequency range (fm to fn) is set and monitored, as shown in FIG. 5B. In this case, the side-band wave is enlarged and monitored along the frequency axis.

Figure 6:
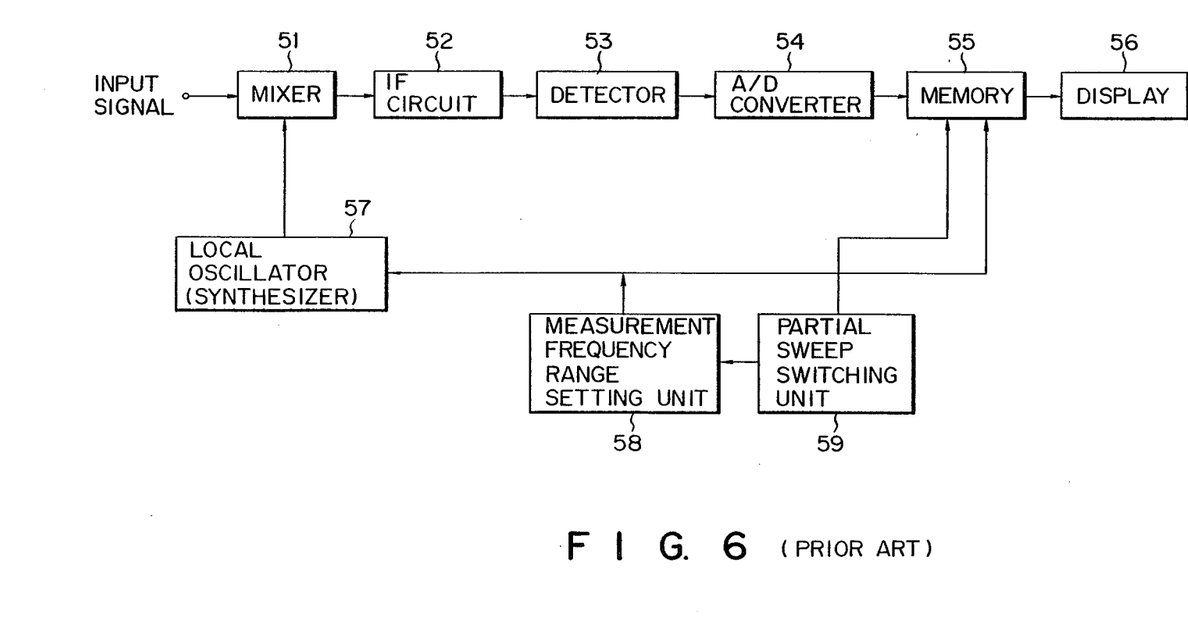
FIG. 6 is a block diagram showing an arrangement of a conventional network analyzer.

Meanwhile, a network analyzer is known in which a signal of a known frequency is supplied to an object to be measured and the output signal from the object is analyzed to evaluate characteristics of the object. In the network analyzer (MS420B/K, MS560J, MS620J, available from ANRITSU CORPORATION), a partial sweep operation is performed. FIG. 6 shows the arrangement of the main part of the network analyzer, and its operation will be described with reference to FIG. 6.

Local oscillator 57 comprises a frequency synthesizer and oscillates in accordance with data (binary digital signal) according to a frequency range set by measurement frequency range setting unit 58. Local oscillator 57 sends its output signal to mixer 51, so that an input signal within a predetermined frequency range is converted into an intermediate frequency (IF) signal. The IF signal is detected by detector 53 through IF circuit 52. Thereafter, the detection output from detector 53 is converted from an analog signal to a digital signal by A/D converter 54. The digital signal output from A/D converter 54 is stored in memory 55 in correspondence with frequency data from measurement frequency range setting unit 58, and is then displayed on display 56. In this arrangement, a partial sweep operation is performed as follows. This operation will be described with reference to FIGS. 5A and 5B.

A desired entire frequency range (fi to fh) on the frequency axis is designated by measurement frequency range setting unit 58, and an input signal within the range is measured and displayed on a display screen (this operation will be referred to as an entire frequency sweep operation hereinafter).

Partial sweep switching unit 59 is then turned on, and measurement frequency range setting unit 58 sets a desired partial frequency range (fm to fn). Setting unit 58 digitally sweeps local oscillator 57 so that only an input signal within the partial frequency range (fm to fn) is received at the same frequency step as in the entire frequency sweep mode. Setting unit 58 controls memory 55, so that only a signal level corresponding to the partial frequency range (fm to fn) is updated and displayed on display 56 for every sweep. The values corresponding to other frequency ranges (fi to fn) and (fn to fh) in the entire frequency sweep mode are left unchanged and stored in memory 55, and are displayed on display 56.

In this manner, in the network analyzer having a memory for digital storage and display, and local oscillator 57 comprising a frequency synthesizer capable of easy frequency control based on a binary digital signal, a digital partial sweep operation can be easily performed.

In the conventional spectrum analyzer, when a variation in side-band wave fd is measured while performing a frequency sweep operation shown in FIG. 5A, a wideband sweep operation must be performed and a sweep time becomes too long. In this case, a variation earlier than the sweep time cannot be monitored. When an enlarged sweep operation is performed, as shown in FIG. 5B, carrier wave fc does not appear on the display screen, and the relationship between carrier wave fc and the varying side-band wave cannot be monitored on the single display screen. Therefore, values such as the frequency and level of carrier wave fc must be separately recorded, resulting in inconvenience.

The partial sweep operation performed by the network analyzer achieves an object from the viewpoint of the display screen. However, this technique poses problems in frequency control, as will be described later, and cannot be used in the spectrum analyzer.

(1) Since the spectrum analyzer searches and measures a signal of an unknown frequency, it is not suitable for the digital sweep operation of the network analyzer. For example, assuming that a measurement frequency range between 1 to 2 GHz is covered by 500 points, if the digital sweep operation is performed, a frequency step between adjacent points corresponds to 2 MHz. For this reason, when a resolution bandwidth is small, a spectrum present in a 2-MHz interval may be omitted inadvertently. In order to prevent this, a sweep operation must be performed using a smaller frequency step than the resolution bandwidth, resulting in a bulky, high-cost arrangement. In addition, a measurement speed is decreased.

(2) Since the spectrum analyzer must monitor a variety of modulated signals, it must have a high measurement speed.

However, the measurement speed of the network analyzer is almost determined by a PLL (Phase Locked Loop) response time of a synthesizer used as a local oscillator. For example, if the frequency axis of the display screen is divided into 500 points to perform measurement, it takes about 2 seconds. The PLL response time must be 100 ms or less in a spectrum analyzer.

As described above, when the spectrum analyzer is arranged using the frequency synthesizer as the local oscillator, problems (1) and (2) impair the original performance and functions of the spectrum analyzer.

SUMMARY OF THE INVENTION

It is, therefore, an object of the present invention to provide a new and improved signal analyzer apparatus with an analog partial sweep function in which original performance and functions of a signal analyzer can be maintained, a signal is analyzed by an analog sweep operation in order to perform high-speed measurement, a carrier wave and variation in a signal adjacent to the carrier wave can be easily monitored on a single screen, and a portion to be monitored can be measured at high speed.

According to one aspect of the present invention, there is provided a signal analyzer apparatus comprising:

input means for receiving an input signal to be measured;

local oscillator means for oscillating a local oscillation signal to be analog-swept in accordance with an analog sweep signal;

frequency conversion means for converting the input signal from the input means into an intermediate frequency signal corresponding to the local oscillation signal to be analog-swept from the local oscillator means;

detecting means for detecting the intermediate frequency signal from the frequency conversion means;

A/D conversion means for converting the detection analog signal from the detecting means into a corresponding digital signal;

memory means for storing the digital signal from the A/D conversion means in accordance with its frequency;

display means for displaying the digital signal stored in the memory means along a frequency axis;

sweep range setting means for selectively setting a desired first sweep measurement frequency range and a desired second sweep measurement frequency range present in the first sweep measurement frequency range;

sweep signal generating means for receiving first or second sweep measurement frequency range setting data from the sweep range setting means and supplying the data to the local oscillator means as the analog sweep signal for an entire or partial sweep operation; and display control means, connected between the sweep range setting means and the memory means, for, upon reception of the first sweep measurement frequency range setting data, causing the display means to display the digital signal stored in the memory means in correspondence with the analog sweep signal for the entire sweep operation, and for, upon reception of the second sweep measurement frequency range setting data, causing the display means to update and display the digital signal of a portion corresponding to the second sweep measurement frequency range which is updated in the memory means in correspondence with the analog sweep signal for the partial sweep operation.

In order to achieve the above object, according to another aspect of the present invention, there is provided a signal analyzer for sweeping and receiving an input signal within a desired frequency range, temporarily converting the input signal into an intermediate frequency signal, detecting the intermediate frequency signal, converting the detected signal into a digital signal, and storing and displaying the digital signal in correspondence with a frequency, comprising:

sweep signal generating means for outputting a sweep waveform for controlling a direction and speed of a frequency sweep operation;

measurement frequency range setting means for setting a first sweep measurement range including a carrier wave and a signal of a variation component adjacent thereto, and a second sweep measurement frequency range near the variation component excluding the carrier wave;

waveform detecting mans for detecting waveform data corresponding to data set by the measurement frequency range setting means in accordance with the sweep waveform output from the sweep signal generating means, and feeding back the detected waveform data to the sweep signal generating means so as to obtain a desired sweep waveform;

switching means for, when the first measurement frequency range is swept and measured, outputting an instruction for sweeping and measuring the second measurement frequency range; and display control means for, when the measurement frequency range is switched by the switching means, performing a control operation to store and display data obtained by measuring the second measurement frequency range for every sweep, and to display data stored before switching as measurement data of the first measurement frequency range excluding the second measurement frequency range.

BRIEF DESCRIPTION OF THE DRAWINGS

This and other objects and features of the present invention can be understood through the following embodiment by reference to the accompanying drawings, in which.

DETAILED DESCRIPTION OF THE PREFERRED EMBODIMENT

Figure 1A:
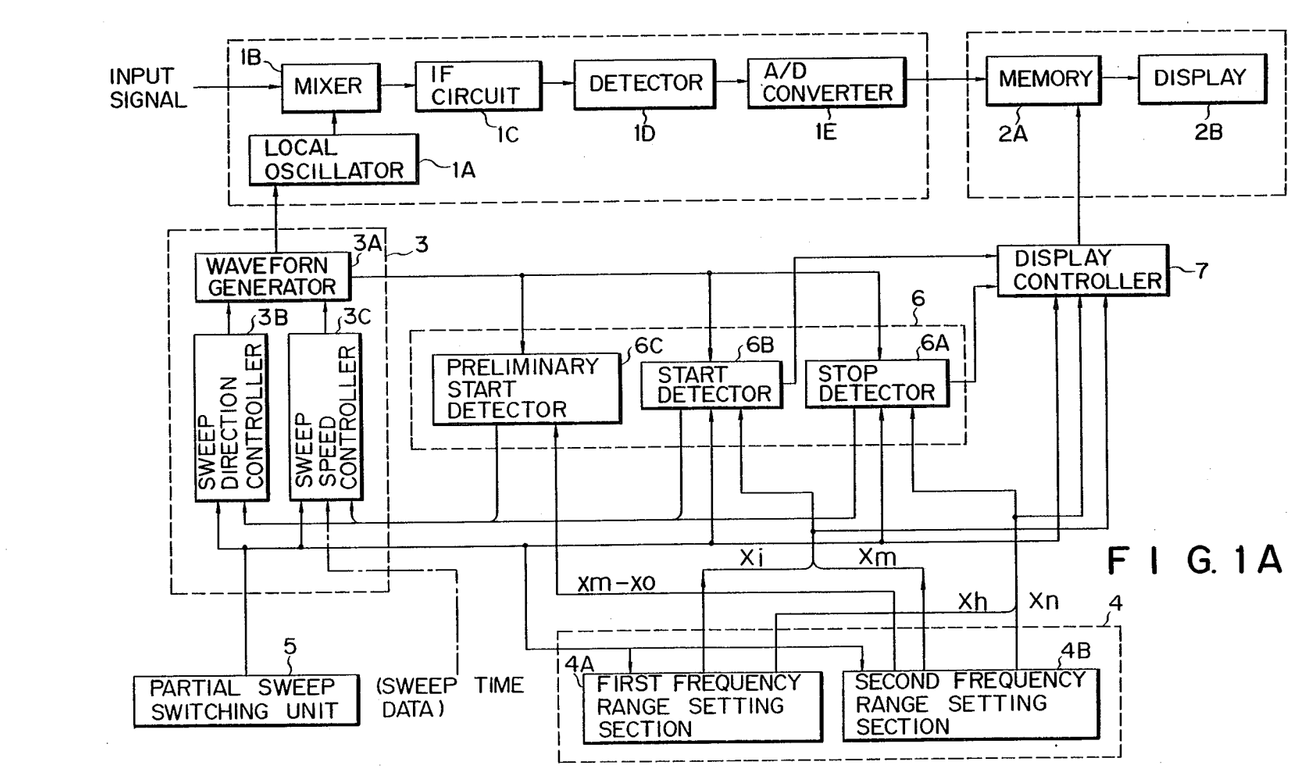
FIG. 1A is a block diagram showing an arrangement of a spectrum analyzer according to an embodiment of the present invention.

FIG. 1A shows an arrangement of a spectrum analyzer as an embodiment of a signal analyzer according to the present invention.

Figure 2A:
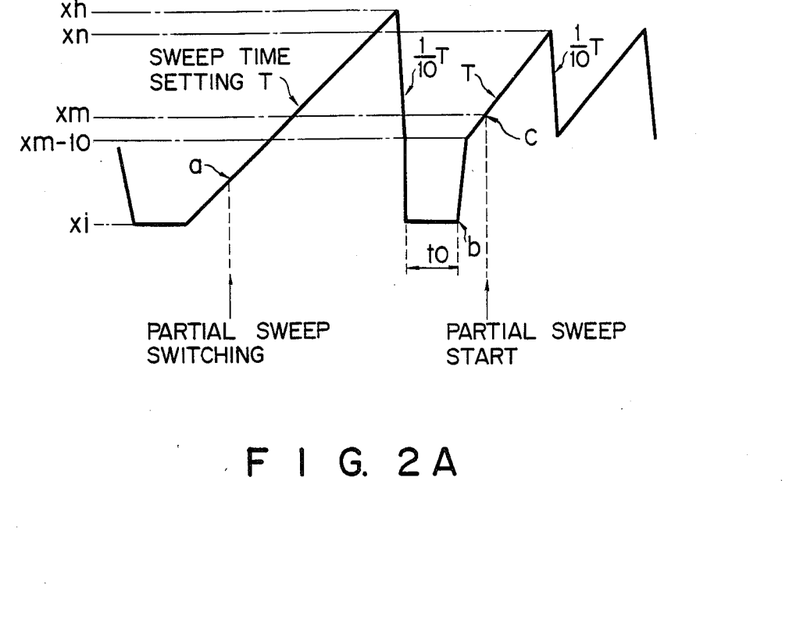
FIGS. 2A, 2B, and 2C are charts showing sweep waveforms.
Figure 2B:
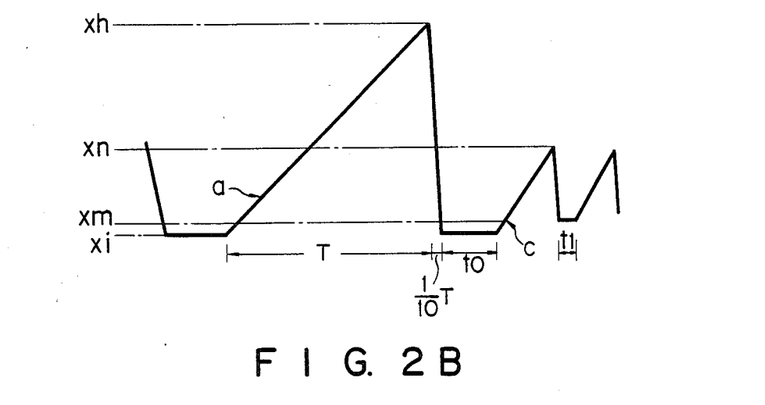
Figure 2C:
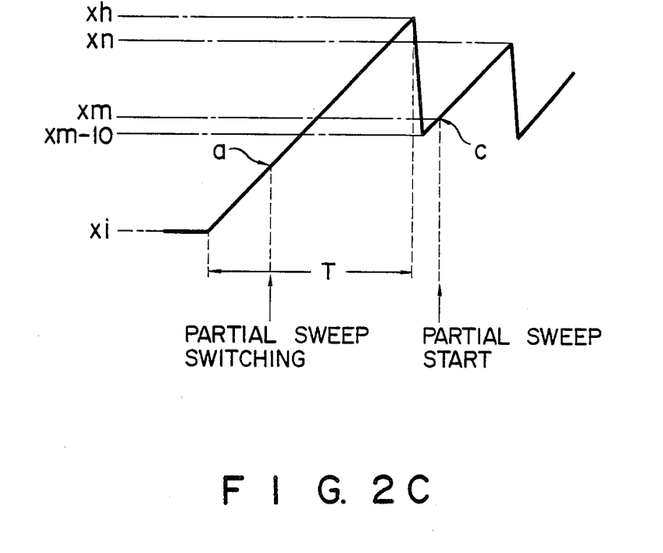

In FIG. 1, reference numeral 1 denotes a receiving unit. In receiving unit 1, mixer 1B mixes an input signal with a signal from local oscillator 1A to convert the input signal into an intermediate frequency (IF) signal. IF circuit 1C then extracts a predetermined frequency component signal from the IF signal. Detector 1D detects the output signal from IF circuit 1C. A/D converter 1E then converts the detection output from detector 1D into a digital signal. Note that local oscillator 1A is driven in response to an analog sweep signal, and can output a swept frequency. Display unit 2 causes memory 2A to store the digital signal output from receiving unit 1 in correspondence with an input frequency, and causes display 2B to display the stored value in correspondence with the input frequency. Sweep signal generating unit 3 causes waveform generator 3A to generate a sweep signal according to a sweep frequency increase/decrease direction instruction from sweep direction controller 3B and a speed instruction from sweep speed signal controller 3C, and to send the sweep signal to local oscillator 1A. FIGS. 2A to 2C show sweep signals. Reference numeral 4 denotes a measurement frequency range setting unit. In unit 4, first frequency range setting section 4A sets an entire measurement frequency range (fi to fh) along the frequency axis of display 2B, and second frequency range setting section 4B sets partial frequency range (fm to fn in FIG. 4) within the entire frequency range (fi to fh). Unit 4 outputs data xi, xh, xm, and xn corresponding to set frequencies fi, fh, fm, and fn.

Figure 3:
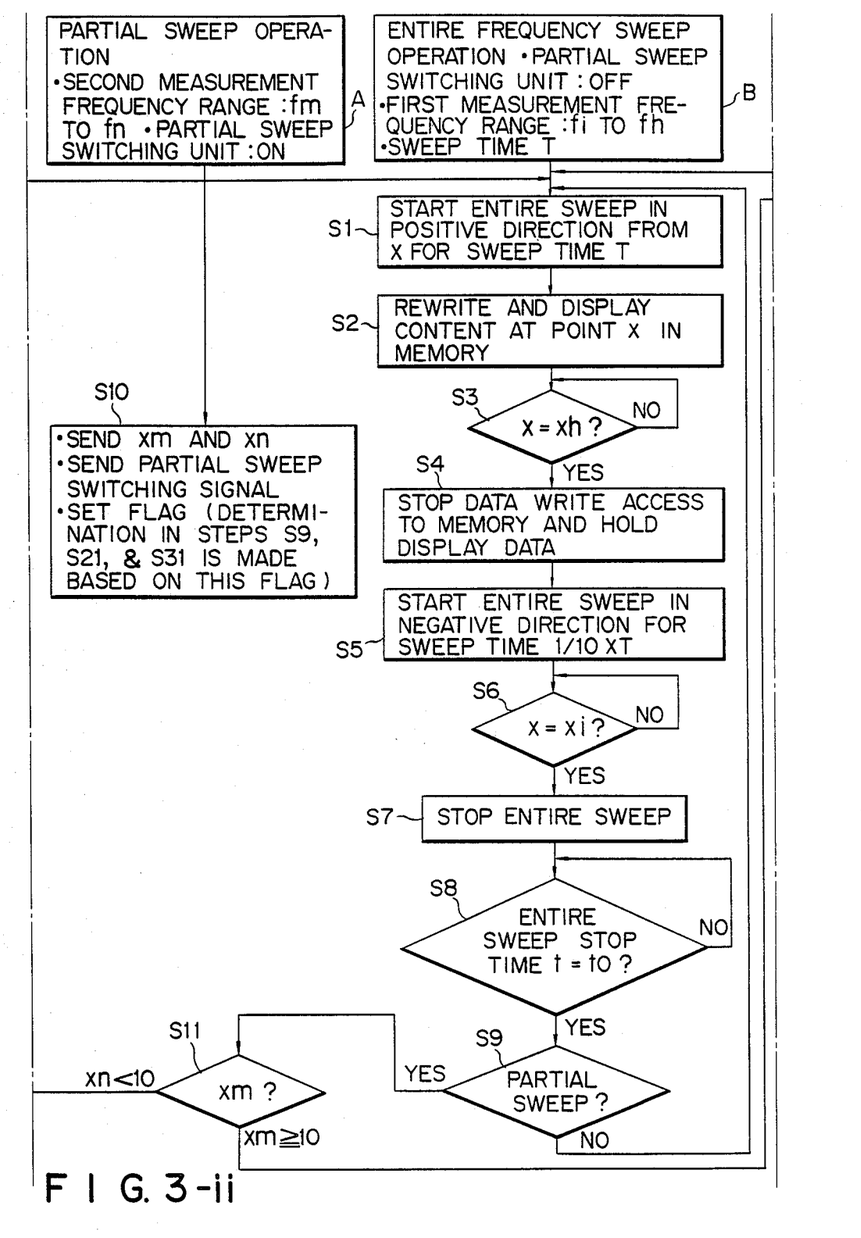
Figure 3I:
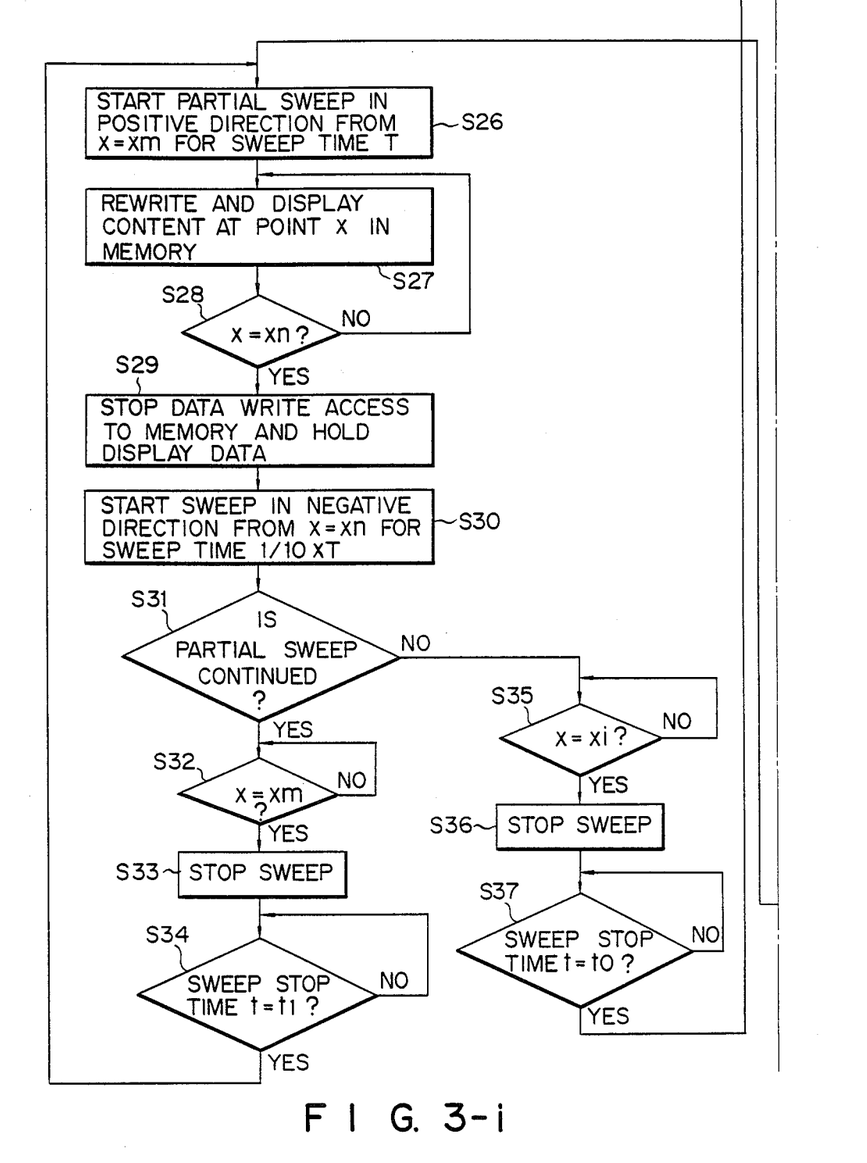
FIGS. 3i, 3ii, and 3iii is a flow chart showing an operation of the embodiment.
Figure 4:
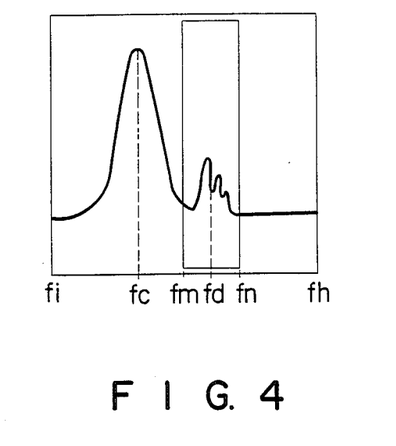
FIG. 4 is a view showing a display state according to the present invention.

The entire and partial frequency ranges can be set in accordance with a start frequency (fi or fm) and a stop frequency (fh or fn) of each range or can be set in accordance with a center frequency and a bandwidth. In FIG. 4, a partial sweep range is surrounded by a square frame and is displayed as a band marker to allow easy observation. The above-mentioned ranges are set by a key or knob. In this case, the first and second frequency range setting sections can commonly use an identical key or knob, and the key or knob can be selectively used. Reference numeral 5 denoted a partial sweep switching unit. When the entire frequency range (fi to fh) is swept and measured, unit 5 is turned off, and when the partial sweep frequency range (fm to fn) is measured, it is turned on. Reference numeral 6 denotes a waveform detecting unit. In detecting unit 6, in the entire frequency sweep mode, frequency range data xi and xh (or xm and xn in the partial frequency mode) from measurement frequency range setting unit 4 are compared with a sweep waveform output from sweep signal generating unit 3 using start and stop detectors 6B and 6A, and the obtained coincidence data are output to sweep signal generating unit 3 and display controller 7. FIG. 2A shows a sweep waveform. Preliminary start detector 6C detects a point set to be lower than a start point (xm) so as to avoid transient response of receiving unit 1 and sweep signal generating unit 3 during a frequency sweep operation, and outputs coincidence data to sweep signal generating unit 3. In FIG. 3, three types of detectors are used. However, one detector can be used and can be time-serially operated. Reference numeral 7 denotes a display controller. Display controller 7 controls memory 2A and display 2B to store and display data from receiving unit 1 in correspondence with an input signal frequency at a predetermined timing in accordance with an entire or partial frequency sweep mode.

Figure 1B:
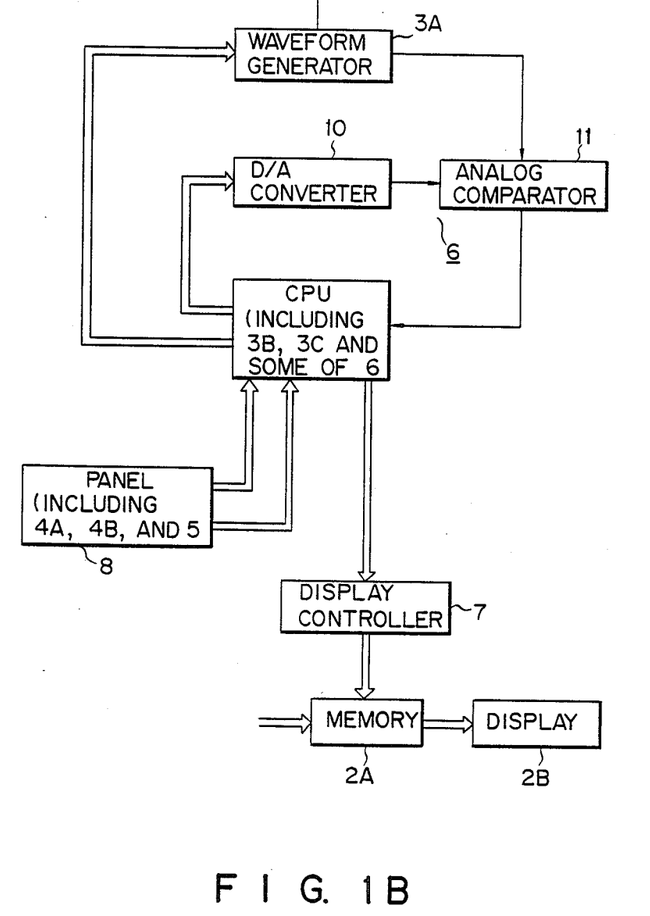
FIG. 1B is a block diagram showing a detailed arrangement of the main part of FIG. 1A.

FIG. 1B shows a detailed arrangement of the main part of FIG. 1A. Panel 8 includes partial sweep switching unit 5, and first and second frequency range setting sections 4A and 4B. The partial sweep switching data and first and second frequency range setting data from panel 8 are input to CPU 9. CPU 9 serves as sweep direction controller 3B and sweep speed controller 3C, and parts of detectors 6A, 6B, and 6C. The sweep direction control data and sweep speed control data from CPU 9 are supplied to waveform generator 3A as in FIG. 1A. The first and second frequency range setting data from CPU 9 are supplied to one terminal of analog comparator 11 through D/A converter 11. D/A converter 10 and analog comparator 11 constitute parts of detectors 6A to 6C. The other terminal of analog comparator 11 receives an analog waveform for obtaining a predetermined sweep signal from waveform generator 3A, as described above. The output from analog comparator 11 is fed back to CPU 9 as the output from waveform detecting unit 6 described above. When CPU 9 receives the coincidence data from analog comparator 11, it supplies data corresponding to a waveform detection output to waveform generator 3A, D/A cnverter 10, and display controller 7 as in FIG. 1A. The remaining arrangement is the same as that shown in FIG. 1A.

FIGS. 2A to 2C show sweep signal waveforms as an output from waveform generator 3A, FIG. 3 is a flow chart showing an operation of the spectrum analyzer according to this embodiment, and FIG. 4 shows a display state.

The operation of the spectrum analyzer will be described hereinafter with reference to these drawings. Note that step numbers in the following description are shown in FIG. 3.

(1) Partial sweep switching unit 5 is turned off, and the entire sweep frequency range (fi to fh) is set by first frequency range setting section 4A, thus starting the entire frequency sweep operation. A sweep time at this time is given as T. (Sweep time T can be set in sweep speed controller 3C by inputting a desired time using external keys.)

(2) Start detector 4B compares the sweep waveform from sweep signal generating unit 3 shown in FIG. 2A with data xi corresponding to fi from the first frequency setting section. When a coincidence is detected, detector 4B outputs xi coincidence data to sweep direction controller 3B and sweep speed controller 3C.

(3) Upon reception of the xi coincidence data, controllers 3B and 3C instruct positive-direction sweep (frequency increase direction) and preset sweep time T to waveform generator 3A to cause it to generate a waveform corresponding to the instructions. Generator 3A then sends the waveform to local oscillator 1A of receiving unit 1 (step S1).

(4) Receiving unit 1 sweeps and receives an input signal in a desired frequency range in accordance with the sweep signal from waveform generator 3, and converts the obtained data into digital data. Unit 1 then outputs the digital data to memory 2A.

(5) Display controller 7 receives data (xi to xh) from first frequency range setting section 4A and start data from start detector 6B, and causes memory 2A and display 2B to sequentially store and display data from receiving unit 1 in correspondence with an input frequency (FIG. 4 shows a display state). Controller 7 continues storage and display operations until stop data from stop detector 6A arrives (step S2).

(6) Stop detector 6A compares data xh corresponding to fh output from first frequency range setting section 4A with the sweep waveform from waveform generator 3A. When a coincidence is detected therebetween, detector 6A sends xh coincidence data to controllers 3B and 3C (step S3).

(7) Upon reception of the xh coincidence data, controllers 3B and 3C respectively instruct a negative sweep direction (frequency decrease direction) and sweep time $(1/10) \times T$ to waveform generator 3A and cause generator 3A to output the waveform according to the instructions to local oscillator 1A, thereby controlling the output from local oscillator 1A (step S4).

(8) When start detector 6B detects a coincidence with xi again while the sweep waveform progresses in the negative sweep direction (step S6), controllers 3B and 3C receiving the coincidence data instruct waveform generator 3A to stop sweep for a predetermined period of time (t0) (step S7).

Upon reception of the sweep stop instruction, waveform generator 3A maintains a level slightly deviated from xi in the negative direction for time period t0. After time period t0 has passed, generator 3A is operated to form a sweep waveform in the positive direction (step S8).

When partial sweep switching unit 5 is turned on during the entire frequency sweep period, a flag is set by unit 5. Therefore, during the entire frequency sweep stop period, waveform detecting unit 6, sweep signal generating unit 3, and display controller 7 check this flag and are switched to the partial sweep mode (step S9).

Note that in steps S21 and S31 to be described later, it is determined based on this flag if partial sweep switching unit 5 is turned on.

(9) During the negative-direction sweep time and sweep stop time, display controller 7 causes memory 2A to stop reading data based on the stop data from stop detector 6A, and causes display 2B to display the previously stored value (step S4).

(10) One period of the entire frequency sweep operation (fi to fh) has been described. When the entire frequency sweep operation is to be continued, items (1) to (9) are repeated. During the entire frequency sweep period, an operator can set a band marker (xm to xn) as indicated by a square frame in FIG. 4 using second measurement frequency range setting section 4B. When partial sweep switching unit 5 is turned on, the range of the band marker serves as a desired partial sweep frequency range. The partial sweep operation will be described below.

(11) When partial sweep switching unit 5 is turned on at point a of the sweep waveform shown in FIG. 2A during the entire frequency sweep operation, unit 5 generates a switching signal, and instructs to set frequency data (xm-xo), xm, and xn corresponding to the partial sweep frequency range (fm to fn) in detectors 6C, 6B, and 6A, respectively. Unit 5 also instructs to set an initial partial sweep speed which is, e.g., 10 times that in the entire sweep mode (i.e., the sweep time is 1/10 that in the entire sweep mode) (step S10).

Data (xm-xo) is obtained by subtracting xo from xm corresponding to fm when second frequency range setting section 4B sets fm. Assuming that the number of display points along the frequency axis on display 2B in the entire frequency sweep mode is 500, data xo is set to be xo=10 if xm indicates 10 points or more, and is set to be xo=0 if xm indicates 9 points or less.

(12) Upon reception of these instructions, detectors 6C, 6B, and 6A, and controller 3C temporarily store these instructions, and are set so that an instruction from unit 5 is valid after the entire frequency sweep period is ended during partial sweep switching mode and sweep stop time period t0 has passed, i.e., after point b in FIG. 2A (steps S8 & S9).

If xm<10, preliminary start detector 6C is not operated, and if xm≧10, it starts a preliminary sweep operation.

An operation when xm≧10 will be described below.

(13) After the entire frequency sweep operation is completed and time period t0 has passed, i.e., at time b in FIG. 2A, controllers 3C and 3B instruct sweep time T×(1/10) and a positive direction sweep to waveform generator 3A, and drive local oscillator 1A in accordance with the waveform satisfying the instructions (step S12).

(14) Preliminary start detector 6C compares the output waveform from waveform generator 3A with value (xm−10). When a coincidence is detected therebetween, detector 6C outputs a preliminary sweep start instruction. In response to this instruction, controllers 3C and 3B instruct sweep time setting T and positive-direction sweep to waveform generator 3A, and cause it to send a waveform corresponding to the instruction contents to local oscillator 1A (steps S13 & S14).

(15) Start detector 6B compares the sweep waveform and value xm. When a coincidence is detected therebetween, detector 6B sends xm coincidence data to display controller 7 (step S15).

(16) Receiving unit 1 receives and detects an input signal falling within the frequency range corresponding to the sweep signal from waveform generator 3A, and converts the obtained data into digital data. Unit 1 then sends the digital data to memory 2A (step S16).

(17) Upon reception of the xm coincidence data, display controller 7 loads only data between xm and xn of data from receiving unit 1 with reference to frequency data xi and xh in the entire frequency sweep mode, and replaces the data previously displayed on display 2B in the entire frequency sweep mode with the data within a range of xm to xn as the partial frequency range, thus displaying the data within the partial frequency range (step S17). Therefore, display 2B displays data in the entire frequency sweep mode in the ranges (fi to fm) and (fn to fh), and displays actually swept and measured data in the range (fm to fn).

A sweep operation between a point (xm−10) to a point xm (point c in FIG. 2A) in FIG. 2A corresponds to preliminary sweep. This period is a preliminary period for avoiding the influence of transient response of blocks during the sweep operation up to the point (xm−10) and precisely setting the position of sweep start point xm for measurement. During this period, display data is not updated, and data in the entire frequency sweep mode or in the previous partial frequency sweep mode is displayed.

(18) While the partial frequency sweep operation progresses from point c, stop detector 6A compares the sweep waveform from waveform generator 3A with xn. When a coincidence is detected therebetween, detector 6A outputs xn coincidence data (step S18), and instructs display controller 7 to maintain storage and states of memory 2A and display 2B upon reception of the xn coincidence data (step S19).

(19) Controllers 3B and 3C also receive the xn coincidence data, instruct negative-direction sweep and sweep time setting T×(1/10) to waveform generator 3A, and cause it to send a waveform corresponding to the instruction content to local oscillator 1A (step S20).

(20) When partial sweep switching unit 5 is turned off during the partial sweep period, the sweep mode is switched to the entire frequency sweep mode (step S21). After the switching operation, control returns to the start point (step S1) of the entire frequency sweep operation through steps S23 to S25. The operations in steps S23 to S25 are the same as that in steps S6 to S8. When the partial sweep operation is to be continued, preliminary start detector 6C receives the sweep waveform which is being swept in the negative direction, compares the sweep waveform and value (xn−10) (step S22), and supplies (xm−10) coincidence data to controllers 3B and 3C. Thus, controllers 3B and 3C instruct positive-direction sweep and sweep time setting T to waveform generator 3A (step S14).

(21) Thereafter, the same operation as in items (16) to (20) is continued until the partial sweep switching unit 5 is turned off.

In the above description, the preliminary sweep operation is performed in steps S12 to S25 when xm is equal to or larger than 10. An operation when xm is equal to or smaller than 9 is performed as shown in steps S26 to S37 in FIG. 3. The operation in steps S26 to S37 is the same as that in steps S16 to S25 except for steps S33 and S34. In steps S33 and S34, the sweep operation is stopped for time period t1 before the partial sweep operation is started. FIG. 2B shows the output waveform of waveform generator 3A when xm is equal to or smaller than 9. Sweep stop time period t1 is not always required. FIG. 2C shows an embodiment wherein after the partial sweep switching instruction is output, the partial frequency sweep operation is started during the negative sweep operation in the entire frequency sweep mode.

As described above, when a signal in a given frequency range is received by an analog sweep operation, and the data is sequentially stored and displayed, the sweep mode is switched to a mode for selecting and measuring a portion of the frequency range. Thus, the data in the selected range is displayed while being updated for every measurement. As data outside the selected range, the data before the measurement mode was switched is left unchanged and displayed. Therefore, the relationship between a given stable carrier wave signal and a variation component adjacent thereto can be simultaneously monitored on a single screen. A component to be monitored, such as a variation component, can be measured at high speed.

Furthermore, this invention can be applied a network analyzer having a signal generating section which outputs a frequency swept signal and a receiving section which frequency sweeping and tracking with the signal of the signal generating section, to thereby measure transmission characteristics of object. In this case, the receiving section of the network analyzer may be replaced by the spectrum analyzer as described above.

What is claimed is:

1. A signal analyzer apparatus comprising:
    input means for receiving an input signal to be measured;
    local oscillator means for oscillating a local oscillation signal to be analog-swept in accordance with an analog sweep signal;
    frequency conversion means for converting the input signal from said input means into an intermediate frequency signal corresponding to the local oscillation signal to be analog-swept from said local oscillator means;
    detecting means for detecting the intermediate frequency signal from said frequency conversion means;
    A/D conversion means for converting the detection analog signal from said detecting means into a corresponding digital signal;
    memory means for storing the digital signal from said A/D conversion means in accordance with its frequency;
    display means for displaying the digital signal stored in said memory means along a frequency axis;
    sweep range setting means for selectively setting a desired first sweep measurement frequency range and a desired second sweep measurement frequency range present in the first sweep measurement frequency range;
    sweep signal generating means for receiving first or second sweep measurement frequency range setting data from said sweep range setting means and supplying the data to said local oscillator means as the analog sweep signal for an entire or partial sweep operation; and
    display control means, connected between said sweep range setting means and said memory means, for, upon reception of the first sweep measurement frequency range setting data, causing said display means to display the digital signal stored in said memory means in correspondence with the analog sweep signal for the entire sweep operation, and for, upon reception of the second sweep measurement frequency range setting data, causing said display means to update and display the digital signal of a portion corresponding to the second sweep measurement frequency range which is updated in said memory means in correspondence with the analog sweep signal for the partial sweep operation.

2. An apparatus according to claim 1, further comprising: waveform detecting means, connected between said sweep signal generating means, said sweep range setting means, and said display control means, for comparing waveform data of the analog sweep signal with the first or second sweep measurement frequency range setting data, and for outputting feedback data to said sweep signal generating means, and control data to said memory means.

3. An apparatus according to claim 2, wherein said waveform detecting means includes means for detecting coincidence data for the entire or partial sweep operation.

4. An apparatus according to claim 3, wherein the coincidence data at least includes start data and stop data.

5. An apparatus according to claim 4, wherein the coincidence data includes preliminary start data.

6. An apparatus according to claim 1, wherein said sweep signal generating means includes means for providing, upon successive reception of the first and second sweep measurement frequency range setting data, a predetermined rest period between the analog sweep signals for the entire and partial sweep operations.

7. A signal analyzer comprising:
    a receiving unit, having a local oscillator which can be frequency controlled by an analog sweep signal, for sweeping and receiving an input signal, converting the input signal into an intermediate signal, detecting the intermediate signal, converting the detected signal into a digital signal, and outputting the digital signal;
    display means, having a memory for storing therein the digital signal from said receiving unit as data in accordance with the frequency of the input signal, and for displaying the stored data in accordance with the frequency of the input signal;

sweep signal generating means for outputting an analog sweep waveform for sweep-controlling a frequency of said local oscillator in a desired direction and at a desired speed;

measurement frequency range setting means for setting a desired first sweep measurement frequency range and a second measurement frequency range present in the first sweep measurement frequency range, and outputting frequency range data corresponding to the first and second sweep measurement frequency ranges;

waveform detecting means for comparing the frequency range data from said measurement frequency range setting means with the output waveform from said sweep signal generating means, detecting waveform data corresponding to the sweep frequency range from the output waveform, and re-feeding the detected waveform data back into said sweep signal generating means to control said sweep signal generating means so that it generates a desired sweep waveform;

partial sweep switching means for, when said waveform detecting means causes said sweep signal generating means to sweep the first frequency range based on the frequency range data of the first measurement frequency range, outputting a switching signal to said waveform detecting means so that it causes said sweep signal generating means to perform a sweep operation in accordance with the frequency range data of the second measurement frequency range; and display control means for receiving the frequency range data from said frequency range setting means and the switching signal from said partial sweep switching means, for controlling said display means to update only data corresponding to the second measurement frequency range in said memory with data measured for every measurement and displaying the data on said display means, and for maintaining and displaying data measured before the switching operation of said partial sweep switching means on said display means as data outside the second measurement frequency range and within the first measurement frequency range in said memory.

* * * * *

UNITED STATES PATENT AND TRADEMARK OFFICE
CERTIFICATE OF CORRECTION

PATENT NO.  : 4,839,583
DATED       : June 13, 1989
INVENTOR(S) : TAKANO et al

It is certified that error appears in the above-identified patent and that said Letters Patent is hereby corrected as shown below:

In the title page, under "U.S. PATENT DOCUMENTS", insert the following:

(1)   --4,118,666  10/1978  Bernstein.....324/77C
       4,529,930   7/1985  Evel et al....324/77A--

(2)   --FOREIGN PATENT DOCUMENTS 0,201,692  11/1986  European
       61-223663  10/1986  Japan--.

In the Abstract, line 7, "its a frequency" should read
       --its frequency--.

Signed and Sealed this

Twenty-ninth Day of January, 1991

Attest:

HARRY F. MANBECK, JR.

*Attesting Officer*   *Commissioner of Patents and Trademarks*